(12) United States Patent
Castro et al.

(10) Patent No.: US 6,590,610 B2
(45) Date of Patent: Jul. 8, 2003

(54) DIGITAL DOUBLE SAMPLING IN TIME INTEGRATING PIXEL SENSORS

(75) Inventors: Francisco Castro, St. Charles, IL (US); Austin Harton, Oak Park, IL (US)

(73) Assignee: Motorola, Inc., Schaumburg, IL (US)

( * ) Notice: Subject to any disclaimer, the term of this patent is extended or adjusted under 35 U.S.C. 154(b) by 71 days.

(21) Appl. No.: 10/012,988

(22) Filed: Dec. 10, 2001

(65) Prior Publication Data

US 2003/0107671 A1 Jun. 12, 2003

(51) Int. Cl.⁷ .......................... H04N 3/14; H04N 5/335
(52) U.S. Cl. ..................................... 348/297; 348/241
(58) Field of Search ............................... 348/302, 308, 348/241, 243, 297, 295

(56) References Cited

U.S. PATENT DOCUMENTS

| | | | | |
|---|---|---|---|---|
| 5,468,954 A | * | 11/1995 | Furukawa | 250/208.1 |
| 5,565,915 A | * | 10/1996 | Kindo et al. | 348/308 |
| 5,822,468 A | | 10/1998 | Forchheimer et al. | |
| 5,872,596 A | * | 2/1999 | Yanai et al. | 348/297 |
| 6,330,030 B1 | * | 12/2001 | O'Connor | 348/297 |

OTHER PUBLICATIONS

Anders Astrom, Robert Forchheimer, and Per–Erik Danielsson; "Intensity Mappings Within the Context of Near–sensor Image Processing"; IEEE Transactions on Image Processing, vol. 7, No. 12, Dec. 1998, pp. 1736–1741.

M Bohm, et al.; "High Dynamic range Image Sensors in Thin Film on ASIC Technology for Automotive Applications"; D.E. Ricken, W. Gessner (eds.), Advanced Microsystems for Automotive Applications, Springer–Verlag, Berlin, pp. 157–172, 1998. revised Jan. 2000.

\* cited by examiner

*Primary Examiner*—Wendy R. Garber
*Assistant Examiner*—Matthew L Rosendale

(57) ABSTRACT

A double sampling time-integrating pixel sensor having a photo-detector, a capacitor, a comparator and two pixel data buffers. In operation, the photo-current from the photo-detector charges the capacitor and produces a photo-voltage. The photo-voltage sensed by the capacitor and a first reference voltage are compared by the comparator. When the photo-voltage exceeds the first reference voltage, a first global counter value is latched into the first pixel data buffer. When the photo-voltage exceeds a second reference voltage, a second global counter value is latched into the second pixel data buffer. The optical power falling on the photo-detector is determined from the difference between the second and first counter values. An array of sensors is incorporated into a semiconductor device together with circuitry to read and decode the pixel data buffers.

38 Claims, 5 Drawing Sheets

US 6,590,610 B2

DIGITAL DOUBLE SAMPLING IN TIME INTEGRATING PIXEL SENSORS

CROSS REFERENCE TO RELATED APPLICATIONS

The subject matter of the present application is related to copending U.S. application Ser. No. 16/012,944, filed herewith and having the same filing date, titled "TIME INTEGRATING PIXEL SENSOR", which is assigned to Motorola and expressly incorporated herein by reference.

TECHNICAL FIELD

This invention relates generally to techniques and apparatus for image sensing, and more particularly to a method and apparatus for obtaining a digital measurement of a photo-current.

BACKGROUND OF THE INVENTION

A typical optical detector, such a charge-coupled device (CCD), consists of an array of pixels each with its own pn junction photodiodes. Each photodiode has a capacitance associated with it, and when light falls on the detector the resulting photo-current charges the capacitance. The accumulated charge is thus the time integral of the light intensity falling on each pixel. The CCD periodically and sequentially switches the charge to a video line, resulting in a series of pulses, which can be converted into a voltage signal representing the light pattern incident on the array. If the integration time is too long, the device will saturate. If the integration time is too short, the voltage signal will be lost in the noise of the device. When a detector is reset the capacitor is discharged the voltage across the capacitor does not go to zero because of residual electrical noise in the circuit. The noise is referred to as reset noise. For example, a root-mean-square (rms) level of about 100 electrons might remain in the output sense capacitor after each pixel's charge packet is read. The reset noise increases in proportion to temperature, so the problem is more of a concern in devices that need to operate at higher temperatures.

One approach to reducing reset noise is the use of analog differential measurements through a double sampling technique. This approach first mirrors the initial charge offset in the output sense capacitor onto another capacitor and then reads the accumulated signal charge at the predetermined integration time. A differential measurement is performed on these two analog values either on a per-column basis or a on a per-pixel basis. Column-based calculations require twice the bandwidth while pixel-based differential measurements are sensitive to higher temperatures since the initial reading is fed as an output to a differential amplifier. Technology scaling produces additional concerns, as differential measurements become more sensitive to temperature variations and lower biasing levels make reset operations harder to perform.

In light of the foregoing discussion, it can be seen that there is a need in the art to have pixel sensors and image sensor arrays that are more robust in the presence of reset noise.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
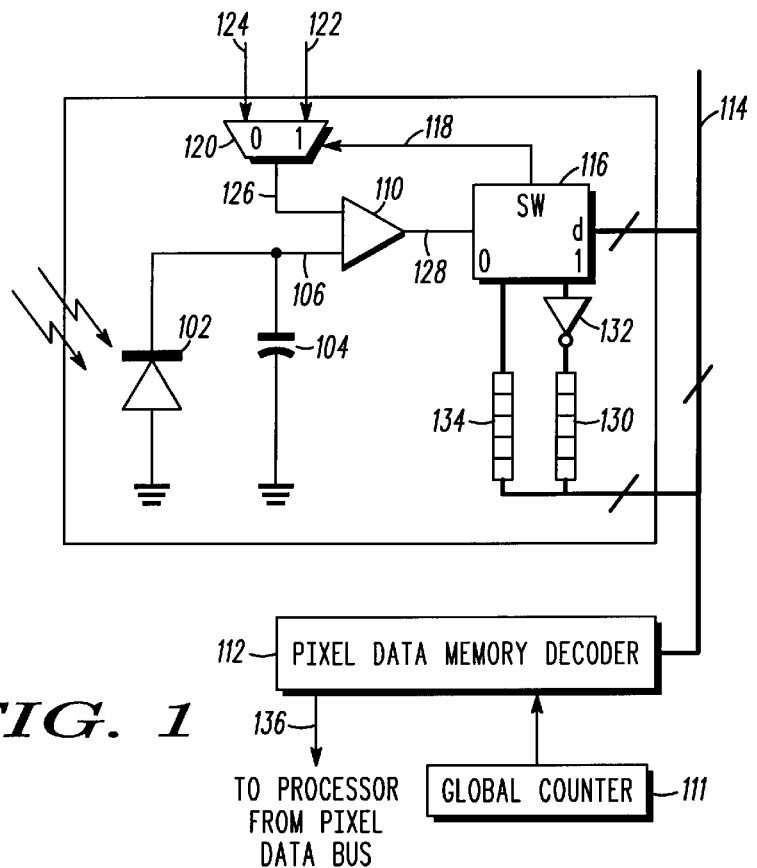
FIG. 1 is a block diagram of a photodiode sensor, in accordance with an aspect of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Referring now to FIG. 1, a time-integrating pixel architecture 100 of a preferred embodiment of the invention is shown. The pixel architecture 100 comprises a photodetector 102 and a floating diffusion capacitor 104 with capacitance $C_{fd}$. In operation, the photo-current charges the floating diffusion capacitor and produces a photo-voltage 106. The charge is allowed to move directly from the photo-detector to the diffusion capacitor without the use of a transfer gate. The photo-voltage 106, sensed by the floating diffusion capacitor, and a reference voltage 126 are supplied as inputs to comparator 110. If the system is reset at time t=0, the voltage V across the capacitor at time t is the time integral of the photo-current i, which is given by $$V = \frac{1}{C_{fd}} \int_0^t i(\tau) \cdot d\tau + V_{reset} = \frac{it}{C_{fd}} + V_{reset},$$

where $C_{fd}$ is the capacitance of the floating diffusion capacitor, t is the integration time of the capacitor and $V_{reset}$ is the voltage due to reset noise. The photo-current is given by $$i = \frac{PqQE\lambda}{hc}$$

where P is the illumination intensity, q is the charge on an electron, $\lambda$ is the wavelength of the light, c is the speed of light, h is Planks constant and QE is the quantum efficiency of the photo-detector. Hence the voltage across the capacitor is related to the integration time $$V = \frac{PqQE\lambda t}{C_{fd}hc} + V_{reset} = \frac{P}{K}t + V_{reset},$$

where $$K = \frac{C_{fd}hc}{qQE\lambda}$$

is a constant. For an illumination intensity $P_i$, the time to reach a reference voltage $V_1$ is $$t_1 = K\frac{(V_1 - V_{reset})}{P_i}.$$

That is, after an integration time $t_1$, the photo-voltage 106 sensed by the floating diffusion capacitor and the reference voltage 126 are equal. In the pixel architecture shown in FIG. 1, a global counter 111 is reset at time t=0. The global counter value is supplied to the pixel architecture via pixel data memory decoder 112 and data bus 114. The switch 116 provides a logic control signal 118 to selector 120, which causes one of the two reference voltages 122 and 124 to passed to the output 126 of the selector 120. Initially, the lower of the two voltages 122 and 124 is selected. When the photo-voltage 106 exceeds the reference voltage 126 for a particular pixel, the output 128 from the comparator 110 changes value. At that time the global counter value is latched and stored in the first pixel data buffer 130. Optionally, the counter value may be negated by passing it through inverter 132. Latching the counter values avoids the need to interrogate the comparator output. In the preferred embodiment, the counter value is stored as a 10-bit value in the pixel data buffer 130. However, different size buffers may be used. Generally, larger buffers are more expensive but provide greater accuracy. One latch is used for each bit in the buffer. In the figure the latching mechanism is assumed to be an integral part of the pixel data buffer. After the counter value has been stored in the first pixel data buffer 130, the logic control signal 118 is switched so that the higher of the two voltages 122 and 124 is passed to the output 126 of the selector 120. This provides a higher reference voltage level. When the higher reference voltage level is exceeded, the value of the global counter is latched into the second pixel data buffer 134. The first and second pixel data buffers then contain the global counter values corresponding to the times taken for the sense capacitor to reach the two reference voltages.

For an illumination intensity $P_i$, the time to reach the higher reference voltage $V_2$ is $$t_2 = K\frac{(V_2 - V_{reset})}{P_i}.$$

The difference between the two integration times is $$t_2 - t_1 = K\frac{(V_2 - V_1)}{P_i}$$

which is not dependent upon the reset voltage $V_{reset}$. The illumination intensity $P_I$ may be calculated as $$P_i = K\frac{(V_2 - V_1)}{t_2 - t_1}.$$

The illumination intensity $P_I$ can therefore be calculated from knowledge of the two reference voltages, the two integration times and the constant K.

The apparatus shown in FIG. 1 provides direct digital values (the two counter values) related to the illumination intensity. This is in contrast to prior systems in which an analog voltage is sensed and then converted to digital value using an analog-to-digital converter. The simplicity of the system of the present invention compared to prior systems allows for sensors that are both smaller and cheaper. In addition, the calculated illumination intensity is not sensitive to the reset voltage.

In FIG. 1, only a single pixel sensor is shown. However, it is envisioned that an array of pixel sensors will be integrated in a single device, such as a CMOS device, may be utilized in conjunction with the present invention. Pixel data memory decoder 112 is coupled to a data bus 114 and is used to decode the data from individual pixel sensors and send it via data bus 136 to a processor (not shown). Logic elements in switch 116 are used to route data from the pixel data buffers 130 and 134 to the bus 114.

Figure 2:
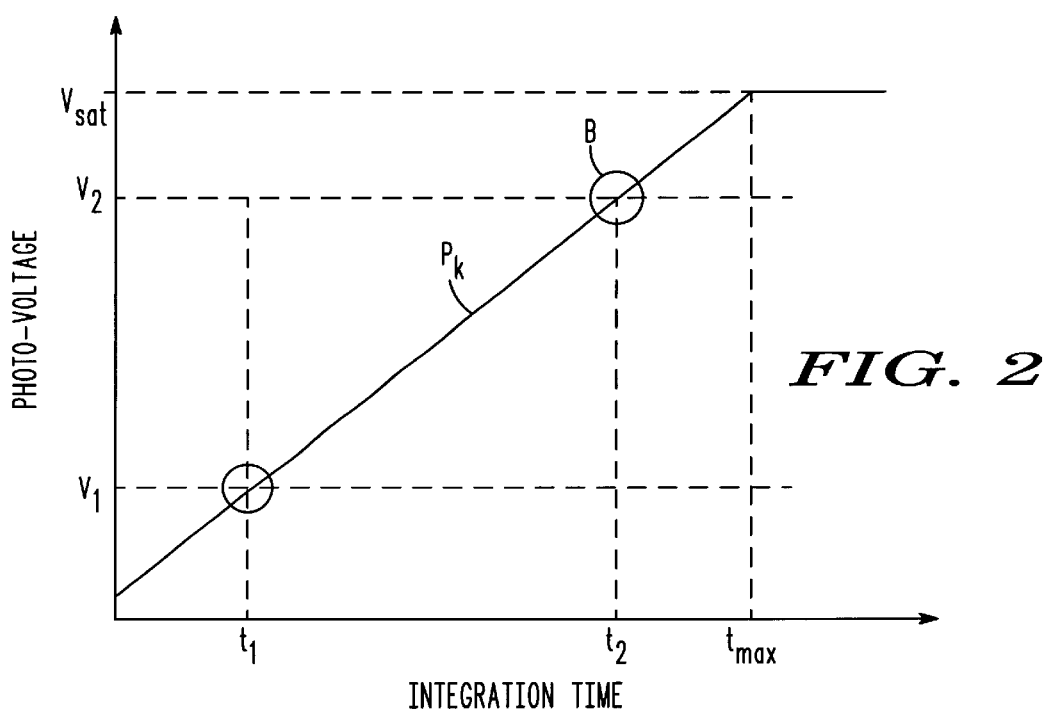
FIG. 2 is a graph of showing photo-voltage as function of integration time for a photodiode sensor, in accordance with an aspect of the present invention.

FIG. 2 is a graph showing photo-voltage as a function of integration time for a photodiode sensor of the present invention. The line labeled $P_k$ shows the relationship between integration time and photo-voltage for light with optical power $P_k$. At time $t_1$, the photo-voltage reaches the first reference voltage $V_1$, as denoted by A in the figure. At this time the output from the comparator (110 in FIG. 1) switches value. This causes the global counter to be latched into the first pixel data buffer (130 in FIG. 1). At a later time $t_2$ the photo-voltage will reach the second reference $V_2$, as denoted by B in the figure. At this time, the global counter is latched into the second pixel data buffer (134 in FIG. 1). At a still later time, $t_{max}$ the photo-voltage will reach the saturation level $V_{sat}$.

If the voltage reference is increased, a longer integration time will be required. If the voltage reference is decreased, a shorter integration time will be required. Even when no light is incident upon the photo-detector, small currents and voltages will be present in the sensor because of electrical noise. Voltage levels below the voltage noise floor will be undetectable, so the first voltage reference level is preferably set above the voltage noise floor. There is an upper limit to the amount of charge that can be stored by the capacitor. The voltage corresponding to this maximum charge is called the saturation voltage. The second voltage reference level is set at or below the saturation voltage.

The integration times may be determined from the difference between the counter values. If the counter value at time $t_1$ is denoted $N_1$ and the counter value at time $t_2$ is denoted $N_2$, the optical power is given by $$P_i = C\frac{V_2 - V_1}{N_2 - N_1},$$

where $C = K \times f_{counter}$ is a constant and $f_{counter}$ is the counter frequency. This computation is performed by the processor. Pixel data memory decoder 112 in FIG. 1 is also used to couple the global counter 111 to the individual pixel sensors via bus 114.

Figure 3:
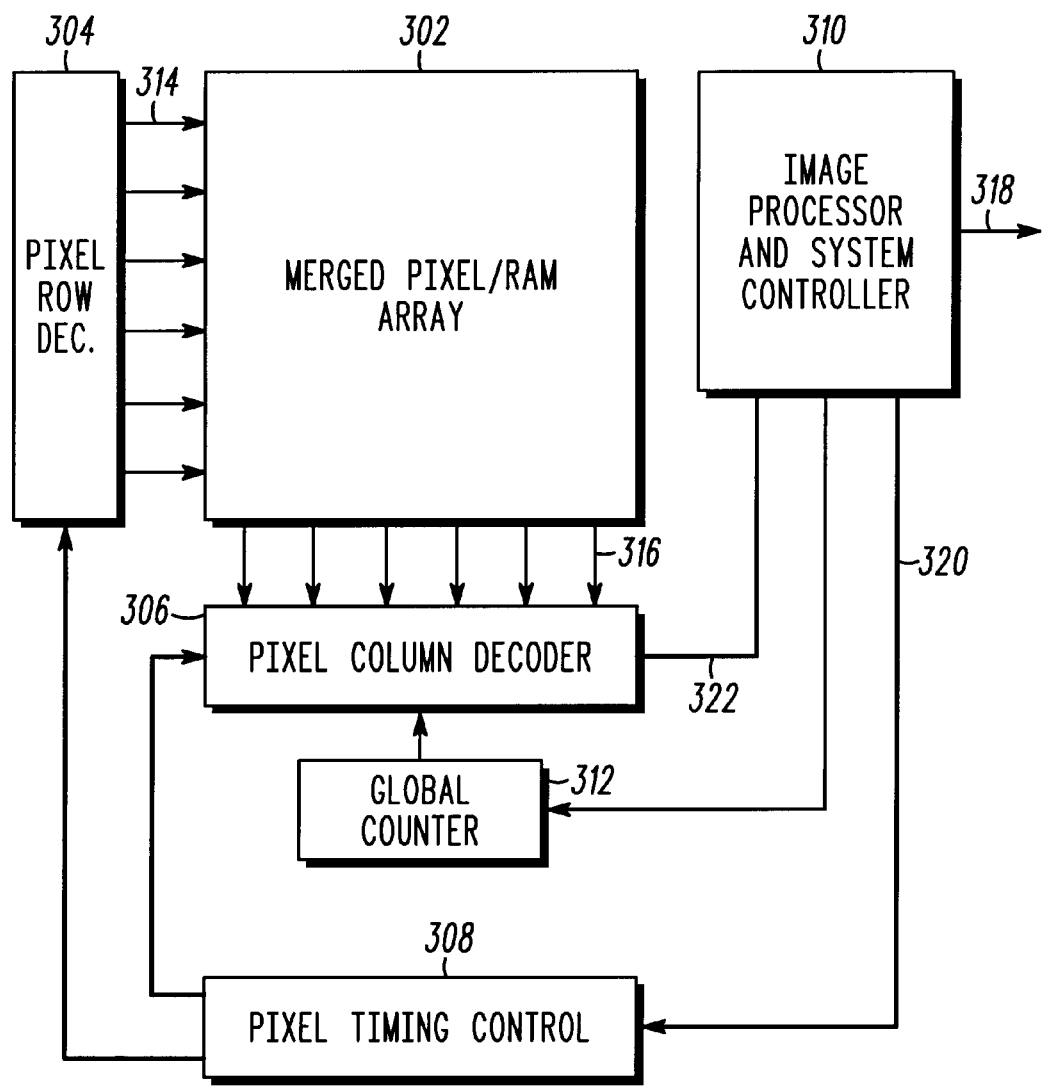
FIG. 3 is a block diagram of a system utilizing a photodiode sensor array, in accordance with an aspect of the present invention.

Referring to FIG. 3, the individual pixel sensors are preferably arranged in an array 302. Each element of the array comprises a photo-detector, a floating diffusion capacitor electrically coupled to the photo-detector and a comparator. The comparator has a first input for receiving a reference voltage, a second input electrically coupled to the floating diffusion capacitor and an output. Each element also includes a pixel data buffer, which may be a random access memory (RAM). The pixel array is addressed in a manner similar to that used to address standard memory (DRAM, SRAM, etc). Each column of pixels is preferably connected to its own data bus. A row address is sent to a pixel row address decoder 304 that selects a particular row of pixels using word lines 314. Pixel column address decoder 306 also includes a data decoder that may be used to receive data from or transmit data to selected columns of pixels, according to the selected row. This allows individual pixels to be addressed, so that data can be "written into" or "read out of" the pixels via pixel bit lines 316. A global sequencer 312 is coupled to the system controller 310. The global sequencer generates lookup table addresses 324 and 334 that are passed to lookup tables 326 and 334. Lookup table 1, 326, is used to convert the lookup table addresses 324 into voltage reference values which are passed to a digital to analog converter (DAC) 328. The DAC 328 in turn generates the reference voltage 108 that is passed to the pixel array 302. Lookup table 2, 334, is used to convert actual counter values into system appropriate digital code values that are passed to the pixels via the pixel column decoder 308. The digital code values need not be linearly related to the actual counter values. The digital code values may correspond to the optical power level associated with the each counter value for a given voltage reference. This avoids the need to compute the optical power levels later. In addition, a pixel timing controller 308 is coupled to the row and column decoders to control the timing of access to the individual elements of the array. The pixel bit data is sensed by the row decoder 306 via bit-lines 316 and the data is sent as a multiplexed data stream 322 to the image processor and system controller 310. The image processor performs the conversion from integration time to optical power for each of the pixel sensors and may perform other image processing functions, such as color processing or compression. Data representing the processed image is output from the image processor at 318. The conversion may be performed via a lookup table or via a calculation or by a combination thereof. The system controller, included in 310, provides pixel array timing and control signals 320 that are passed to a pixel timing and control unit 308. The pixel timing and control unit 308 controls the pixel row decoder 304 and the pixel column decoder 306. The system controller, included in 310, also provides control of the global counter 312.

Figure 4:
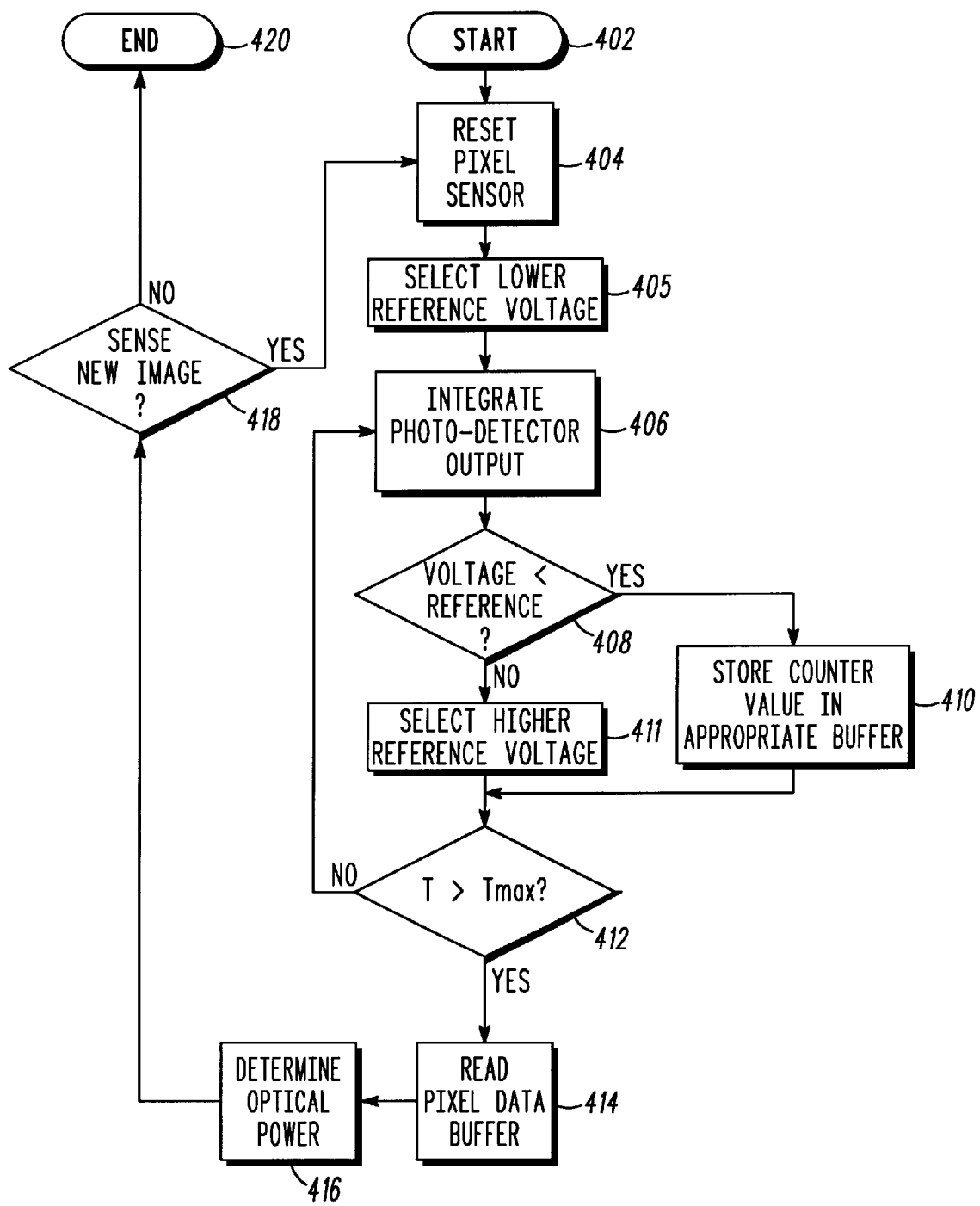
FIG. 4 is a flow chart showing a method of sensing optical power in accordance with the present invention.

A flow chart depicting one embodiment of the method of the current invention is shown in FIG. 4. Operation begins at start block 402. The pixel photo-detector is reset at block 404, by discharging the floating diffusion capacitor for example. The lower of the two reference voltages is selected at block 405. The output from the photo-detector is integrated at block 406. If a floating discharge capacitor is used, the photo-detector output current is integrated by the capacitor to produce a photo-voltage. At decision block 408 the photo-voltage is compared with the reference voltage. If the photo-voltage is less than the reference voltage as depicted by the positive branch from decision block 408, the current value of a global counter (which is supplied to the pixel sensor) is stored into a first pixel data buffer at block 410. Flow than continues to decision block 412. If the photo-voltage exceeds the reference voltage, as depicted by the negative branch from decision block 408, the higher reference voltage is selected at block 411 and the integration process continues. Decision block 408 may be implemented as a comparator. Thus the last value stored in the first pixel data buffer will be the counter value at which the photo-voltage reaches the lower reference voltage. The value is thus latched into the pixel data buffer. While the photo-voltage is less than the higher reference voltage as depicted by the positive branch from decision block 408, the current value of the global counter is stored into a second pixel data buffer at block 410. When the higher reference voltage is exceeded, the current global counter value is not longer written into the second pixel data buffer, so the value when the threshold was crossed is latched into the buffer. At decision block 412, a check is made to determine if the maximum time for integration has been exceeded. If the maximum time has been exceeded, as depicted by the positive branch from decision block 412, the pixel data buffer is read. If the maximum time has not been exceeded, as depicted by the negative branch from decision block 412, the system waits until the time has been exceeded. At block 414, the pixel data buffers are read, whether or not the reference voltages have been reached. At block 416, the optical power is determined from the counter values read from the pixel data buffers. This determination may be performed in an integrated processor or in a processor external to the sensor array. The determination may use the calculation $$P_i = C \frac{V_2 - V_1}{N_2 - N_1},$$

as described above. When inverter 132 in FIG. 1 is used, the value $(-N_1)$ is stored in the first pixel data buffer, so the denominator in the expression can be computed by simply adding the values from the two pixel data buffers.

The calculation may be performed by use of a lookup table indexed by the counter difference $N_2-N_1$, or indexed by the integration time calculated from the counter difference.

In the embodiment described above, each pixel element includes two data buffers and the computation of the difference $N_2-N_1$ is performed by a processor external to the pixel element. In an alternative embodiment the sum $N_2+(-N_1)$ is performer by an adder integrated with each pixel element. The adder may be a serial adder or a parallel adder. An advantage of this embodiment is that the data rate from an array of pixel elements to an external processor is reduced by a factor of two, since only the difference between counter values is passed to the processor.

In a still further embodiment, the pixel array is configured as an integrated circuit that includes one or more adders that are shared by the pixel elements. Again, data flow to an external processor is reduced.

In a still further embodiment, the pixel data buffers are not integrated with each pixel element. Instead, a central memory is used for all of the pixel elements. This central memory may be part of an integrated circuit including the pixel array or may be a separate memory either packaged with the pixel array or connected to it via a data bus.

Figure 5A:
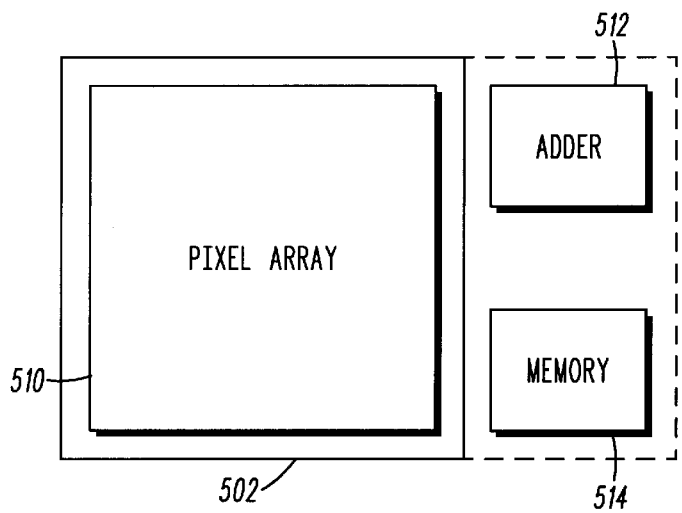
FIGS. 5A–5C are block diagrams of three alternative embodiments of devices in accordance with the present invention.
Figure 5B:
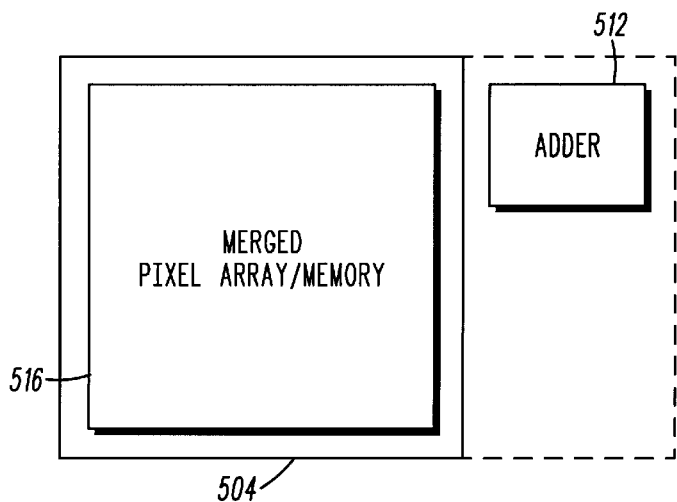
Figure 5C:
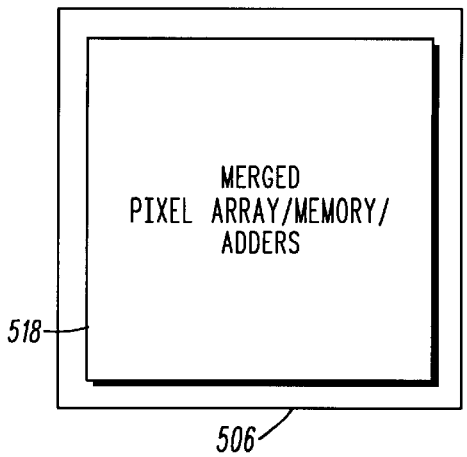

Some of these various embodiments are shown in FIGS. 5A–5C. FIG. 5A depicts a pixel sensor array 502 that includes an array of pixel elements 510. The adder 512 and the pixel data memory 514 is not integrated with each individual pixel element. Instead either may be integrated with the pixel array in a single integrated circuit, as depicted by the dashed line, or they may be separate from the pixel array integrated circuit and connected to it via a bus. FIG. 5B depicts a pixel sensor array 504 in which the adder 512 is not integrated with each individual pixel element. However, the pixel data memory and the pixel elements are integrated in merged pixel array/memory unit 516. As shown in FIG. 1, each pixel element has two data buffers associated with it. The adder 512 may be integrated with the pixel array in a single integrated circuit, as depicted by the dashed line, or separate from the pixel array integrated circuit and connected to it via a bus. FIG. 5C depicts a pixel sensor array 504 in which an adder and pixel data buffers are integrated with each individual pixel element, so that all elements are included in the merged pixel array/memory array/adder array.518.

Figure 6:
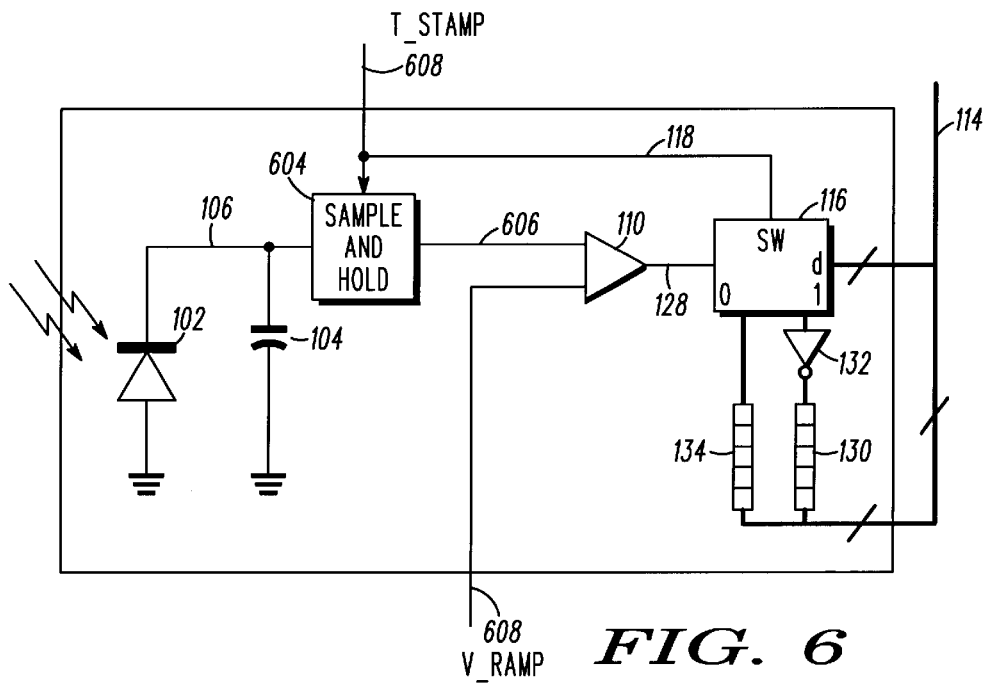
FIG. 6 is a circuit diagram in accordance with an embodiment of the present invention.

A further embodiment of the invention is shown in FIG. 6. The embodiment implements digital double sampling of the photo-voltage. In order to capture two voltage readings within one single frame, and thereby perform digital double sampling, a pixel is designed to operate in a voltage capture mode. Referring to FIG. 6, the T_SAMP signal 602 is a trigger signal that is used to trigger a sample and hold unit 604 and read the photodiode voltage 106 at two different times. The sample and hold (S/H) unit 604 samples the voltage at the capacitor 104 at each sampling instance and latches the value to one of the inputs of the comparator 110. The same signal is also used to control the switching block (SW) 116 so that a digital value from the data bus 114 is read and stored in the register 130 or 134 as appropriate. The V_RAMP signal 608 is a linear voltage ramp used as reference to compare the sampled voltage of the photodiode and load, at the proper instant, a digital value from the bus 114 when the comparator 110 is triggered. Because two different values are sampled at the comparator at different times, the V_RAMP signal must also be ramped through twice to perform the digital mapping of both values. This requires that the data bus operates at twice the speed since a sequence of identical digital values needs to be available twice in the bus within a single frame. The remaining elements of FIG. 6 are described above with reference to FIG. 1.

Figure 7:
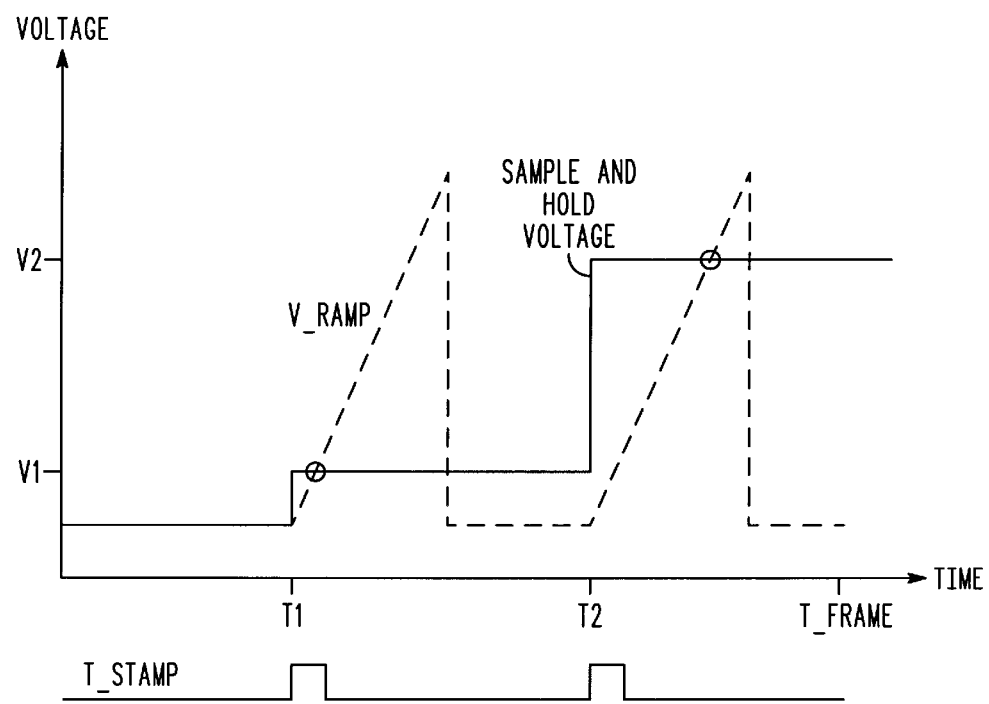
FIG. 7 is a graph illustrative of an embodiment of the present invention.

FIG. 7 illustrates the temporal behavior of the signals T_SAMP and V_RAMP, and the sampled photodiode voltage. The T_SAMP signal provides triggers at times T1 and T2, corresponding to rising edges of the T_SAMP voltage signal. The voltage reference signal V_RAMP, shown as a broken line in the figure, rises from a minimum at times T1 and T2. In this embodiment, the V_RAMP signal has a "saw-tooth" waveform with two pulses in each frame period. At sample time T1 the photo-voltage has reached a level V1. This value is sampled and held, as indicated the plot of the sample and hold voltage. When the V_RAMP signal and the sample and hold signal are equal, as indicated by the point 702, the value from the digital data bus is stored in the first register (130 in FIG. 6). At sample time T2 the photo-voltage has reached a level V2. This value is sampled and held, as indicated the plot of the sample and hold voltage. When the V_RAMP signal and the sample and hold signal are equal, as indicated by the point 704, the value from the digital data bus is inverted stored in the second register (134 in FIG. 6). The values stored in the registers are then read via the data bus and the values are used to determine the optical power falling on this pixel. This process is repeated in each T_FRAME period.

Those of ordinary skill in the art will recognize that the present invention has been described in terms of exemplary embodiments based upon use of a capacitor to integrate the photo-detector output and a comparator to latch the global counter value into a pixel data buffers. However, the invention should not be so limited, since the present invention could be implemented using hardware or software component equivalents to those described and claimed. Many other variations will also be evident to those of ordinary skill in the art.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A time-integrating pixel sensor, comprising:
   a photo-detector;
   a capacitive element electrically coupled to the photo-detector;
   a comparator element having a first input for receiving first and second reference voltages, a second input electrically coupled to the capacitive element and an output;
   a first pixel data buffer responsive to the comparator output and operable to store a first counter value of a global counter when said first reference voltage is exceeded; and
   a second pixel data buffer responsive to the comparator output and operable to store a second counter value of the global counter when said second reference voltage is exceeded.

2. A time-integrating pixel sensor in accordance with claim 1, further comprising:
   a voltage selector having first and second selector inputs and an output electrically coupled to the first input of said comparator and operable to supply a reference voltage thereto; and
   a voltage reference supply element, electrically coupled to first and second selector inputs and operable to supply the first and second reference voltages thereto.

3. A time-integrating pixel sensor in accordance with claim 2, wherein said voltage reference supply element comprises a digital-to-analog converter.

4. A time-integrating pixel sensor in accordance with claim 1, further comprising:
   a global counter, coupled to said first and second pixel data buffers and operable to supply counter values thereto.

5. A time-integrating pixel sensor in accordance with claim 4, further comprising:
   a switch responsive to the comparator output and operable to couple one of said first pixel data buffer and said second pixel data to the global counter.

6. A time-integrating pixel sensor in accordance with claim 1, further comprising:
   an inverter coupled to said first pixel data buffer, operable to negate the first counter value prior to storage in said first pixel data buffer; and
   an adder coupled to said first and second pixel data buffers and operable to add the second counter value to the negated first counter value and thereby obtain a counter difference value.

7. A time-integrating pixel sensor in accordance with claim 6, further comprising a processor operably coupled to said adder, said processor operable to convert said counter difference value to an optical power level.

8. A time-integrating pixel sensor in accordance with claim 7, wherein said processor calculates the optical power level P in accordance with $$P = C\frac{V_2 - V_1}{D},$$

where C is a constant, $V_1$ is the first reference voltage, $V_2$ is the second reference voltage, and D the counter difference value.

9. A time-integrating pixel sensor in accordance with claim 7, wherein said processor uses a lookup table stored in a memory.

10. A time-integrating pixel sensor in accordance with claim 1, further comprising a processor operably coupled to said first and second pixel data buffers and operable to convert said first and second counter values to an optical power level.

11. A time-integrating pixel sensor in accordance with claim 10, wherein said processor calculates the optical power level P in accordance with $$P = C\frac{V_2 - V_1}{N_2 - N_1},$$

where C is a constant, $V_1$ is the first reference voltage, $V_2$ is the second reference voltage, $N_1$ is the first counter value and $N_2$ is the second counter value.

12. A time-integrating pixel sensor in accordance with claim 10, wherein said processor uses a lookup table stored in a memory.

13. A time-integrating pixel sensor in accordance with claim 1, further comprising:
   a pixel data memory decoder coupled to said first and second pixel data buffers.

14. A time-integrating pixel sensor in accordance with claim 1, wherein said first and second pixel data buffers comprise a latch for each bit in each said pixel data buffer.

15. A time-integrating pixel sensor, comprising:
   (a) an array of pixel elements having a plurality of rows and a plurality of columns, each pixel element comprising:
      a photo-detector;
      a capacitive element electrically coupled to the photo-detector;
      a comparator element having a first input for receiving first and second reference voltages, a second input electrically coupled to the capacitive element and an output;
      a first pixel data buffer responsive to the comparator output and operable to store a first counter value of a global counter when said first reference voltage is exceed; and
      a second pixel data buffer responsive to the comparator output and operable to store a second counter value of the global counter when said second reference voltage is exceed;
   (b) a voltage reference supply element, electrically coupled to the first input of said comparator and operable to supply said first and second reference voltages thereto;
   (c) a global counter, operably coupled to said first and second pixel data buffers and operable to supply counter values thereto;
   (d) a pixel row decoder operable to select rows of pixel elements in said array of pixel elements;
   (e) a pixel column decoder operable to select columns of pixel elements in said array of pixel elements and to receive data therefrom; and
   (f) a controller for controlling said pixel row decoder, said pixel column decoder and said global counter.

16. A time-integrating pixel sensor in accordance with claim 15, wherein each pixel element of said array of pixel elements further comprises:
   an inverter coupled to said first pixel data buffer for negating the first counter value stored in said first pixel data buffer; and
   an adder coupled to said first and second pixel data buffers and operable to add the second counter value to the negated first counter value to thereby obtain a counter difference value.

17. A time-integrating pixel sensor in accordance with claim 16, wherein each pixel element of said array of pixel elements further comprises:
   an inverter coupled to said first pixel data buffer for negating the first counter value stored in said first pixel data buffer; and
   further comprising:
      an adder operably coupled to a plurality of said first and second pixel data buffers and operable to add the second counter value and the negated first counter value to thereby obtain a plurality of counter difference values.

18. A time-integrating pixel sensor in accordance with claim 15, further comprising:
   (g) an image processor operable to receive data from said pixel column decoder.

19. A time-integrating pixel sensor in accordance with claim 15, wherein said time-integrating pixel sensor is formed as an integrated circuit semiconductor device.

20. A method for sensing the optical power of light falling on a photo-detector having an input for receiving light and an electrical output, comprising:
   operating a global counter;
   integrating the electrical output of the photo-detector to obtain a photo-voltage;
   comparing said photo-voltage with a first reference voltage;
   latching a first counter value of said global counter into a first pixel data buffer if said photo-voltage is greater than said first reference voltage;
   comparing said photo-voltage with a second reference voltage;
   latching a second counter value of said global counter into a second pixel data buffer if said photo-voltage is greater than said second reference voltage; and
   determining the optical power from said first and second counter values.

21. A method in accordance with claim 20, wherein said determining further comprises:
   reading the first and second counter values from said pixel data buffers;
   calculating a difference value between said second and first counter values; and
   indexing a lookup table by the difference value.

22. A method in accordance with claim 20, wherein said determining further comprises:
   reading the first and second counter values from said pixel data buffers;

calculating a difference value between said second and first counter values; and calculating the optical power P in accordance with $$P = C\frac{V_2 - V_1}{N_2 - N_1},$$

where C is a constant, $V_1$ is the first reference voltage, $V_2$ is the second reference voltage, $N_1$ is the first counter value and $N_2$ is the second counter value.

23. A method for sensing the optical power of light falling on an array of pixel sensors, each sensor having a first pixel data buffer, a second pixel data buffer and a photo-detector with an input for receiving light and an electrical output, said method comprising:

for each pixel sensor of the array of pixel sensors:
integrating the electrical output of the photo-detector to obtain a photo-voltage;
measuring a first integration time as the time taken for said photo-voltage to reach a first reference voltage; and
measuring a second integration time as the time taken for said photo-voltage to reach a second reference voltage; and
determining the optical power from said first and second integration times.

24. A method in accordance with claim 23, wherein for each pixel sensor of the array of pixel sensors, said integrating comprises integrating the electrical output of the photo-detector in a capacitive element.

25. A method in accordance with claim 23, further comprising setting said first reference voltage level in accordance with a minimum of the optical power falling on the array of pixel sensors.

26. A method in accordance with claim 23, further comprising setting said second reference voltage level in accordance with a maximum of the optical power falling on the array of pixel sensors.

27. A method in accordance with claim 23, further comprising:

generating said first and second reference voltages with a digital to analog converter.

28. A method in accordance with claim 23, wherein said measuring comprises:

operating a global counter; and
for each pixel sensor of the array of pixel sensors:
comparing said photo-voltage with a first reference voltage;
latching a first counter value of said global counter into a first pixel data buffer if said photo-voltage is greater than said first reference voltage;
comparing said photo-voltage with a second reference voltage;
latching a second counter value of said global counter into a second pixel data buffer if said photo-voltage is greater than said second reference voltage.

29. A method in accordance with claim 28, wherein said determining further comprises:

decoding a row and column address of a pixel data buffer in said array;
reading the first and second counter values from said pixel data buffers at said row and column address; and
indexing a lookup table by the difference between the second and first counter values.

30. A method in accordance with claim 28, wherein said determining further comprises:

decoding a row and column address of a pixel data buffer in said array;
reading the latched value of the global counter from said pixel data buffer; and
calculating the optical power P in accordance with $$P = C\frac{V_2 - V_1}{N_2 - N_1},$$

where C is a constant, $V_1$ is the first reference voltage, $V_2$ is the second reference voltage, $N_1$ is the first counter value and $N_2$ is the second counter value.

31. A double-sampling pixel sensor, comprising:

a photo-detector;
a capacitive element electrically coupled to the photo-detector;
a sample and hold element having an input electrically coupled to the capacitive element and an output, said sample and hold element operable to respond to a trigger signal;
a comparator element having a first input for receiving a ramp voltage signal, a second input electrically coupled to the output of the sample and hold element and an output;
a first pixel data buffer responsive to the comparator output and operable to store a first counter value of a global counter when said ramp voltage signal is first exceeded; and
a second pixel data buffer responsive to the comparator output and operable to store a second counter value of the global counter when said ramp voltage signal is next exceeded.

32. A double-sampling pixel sensor in accordance with claim 31, further comprising:

a data bus coupled to a global counter and operable to provide a plurality of global counter values; and
a switch operable to receive said trigger signal and configured to couple said data bus to said first or second pixel data buffers according to said trigger signal.

33. A double-sampling pixel sensor in accordance with claim 31, further comprising an inverter operable to invert said second counter value before it is stored in said second pixel data buffer.

34. A double-sampling pixel sensor in accordance with claim 31, wherein said ramp voltage signal has a saw-tooth waveform with two pulses in each frame period.

35. A method for sensing the optical power of light falling on a photo-detector having an input for receiving light and an electrical output, comprising:

generating a ramp voltage signal;
integrating the electrical output of the photo-detector to obtain a photo- voltage;
sampling said photo-voltage at a first time to obtain a first sampled photo-voltage;
comparing said first photo-voltage with said ramp voltage signal;
storing a first digital value into a first pixel data buffer when said first photo-voltage exceeds said ramp voltage signal;
sampling said photo-voltage at a second time to obtain a second sampled photo-voltage;
comparing said second photo-voltage with said ramp voltage signal;
storing a second digital value into a second pixel data buffer when said second photo-voltage exceeds said ramp voltage signal; and determining the optical power from said first and second digital values.

36. A method in accordance with claim 35, wherein said determining further comprises:

reading the first and second digital values from said pixel data buffers;

calculating a difference value between said second and first digital values; and indexing a lookup table by the difference value.

37. A method in accordance with claim 35, further comprising:

supplying a plurality of digital values via a data bus;

connecting said data bus to said first pixel data buffer at said first time; and connecting said data bus to said second pixel data buffer at second first time.

38. A method in accordance with claim 35, wherein said first and second times occur within a frame period and wherein said ramp signal voltage has a saw-tooth waveform with two pulses within each frame period.

* * * * *